United States Patent [19]

Furukawa

[11] 4,270,212
[45] May 26, 1981

[54] CATV CONVERTER

[75] Inventor: Hajime Furukawa, Tokyo, Japan

[73] Assignee: Pioneer Electronic Corporation, Tokyo, Japan

[21] Appl. No.: 74,488

[22] Filed: Sep. 11, 1979

[30] Foreign Application Priority Data

Sep. 13, 1978 [JP] Japan .................. 53-112835

[51] Int. Cl.³ .................. H04H 1/00; H04B 1/18
[52] U.S. Cl. .................. 455/3; 455/131; 455/179; 455/197; 455/313; 358/86
[58] Field of Search .................. 455/3, 5, 6, 131, 179, 455/180, 189, 190, 196, 197, 199, 313, 323; 358/86, 191.1

[56] References Cited

U.S. PATENT DOCUMENTS

| 3,562,650 | 2/1971 | Gossard et al. | 358/86 |
| 3,643,164 | 2/1972 | Sly et al. | 455/131 |
| 3,845,393 | 10/1974 | Basset | 455/196 |
| 3,882,266 | 5/1975 | Walding | 455/190 |

Primary Examiner—Jin F. Ng
Attorney, Agent, or Firm—Fraser and Bogucki

[57] ABSTRACT

In a CATV converter system which converts any of a number of input frequencies to the frequency of a predetermined channel, the converter is bypassed when the input signal selected is of the same frequency as the predetermined channel. Instead of going into the converter the input signal is sent through a filter circuit into the associated circuits, thereby avoiding the generation of a beat frequency that would arise unless the converter frequency were precisely matched to the predetermined channel frequency.

2 Claims, 1 Drawing Figure

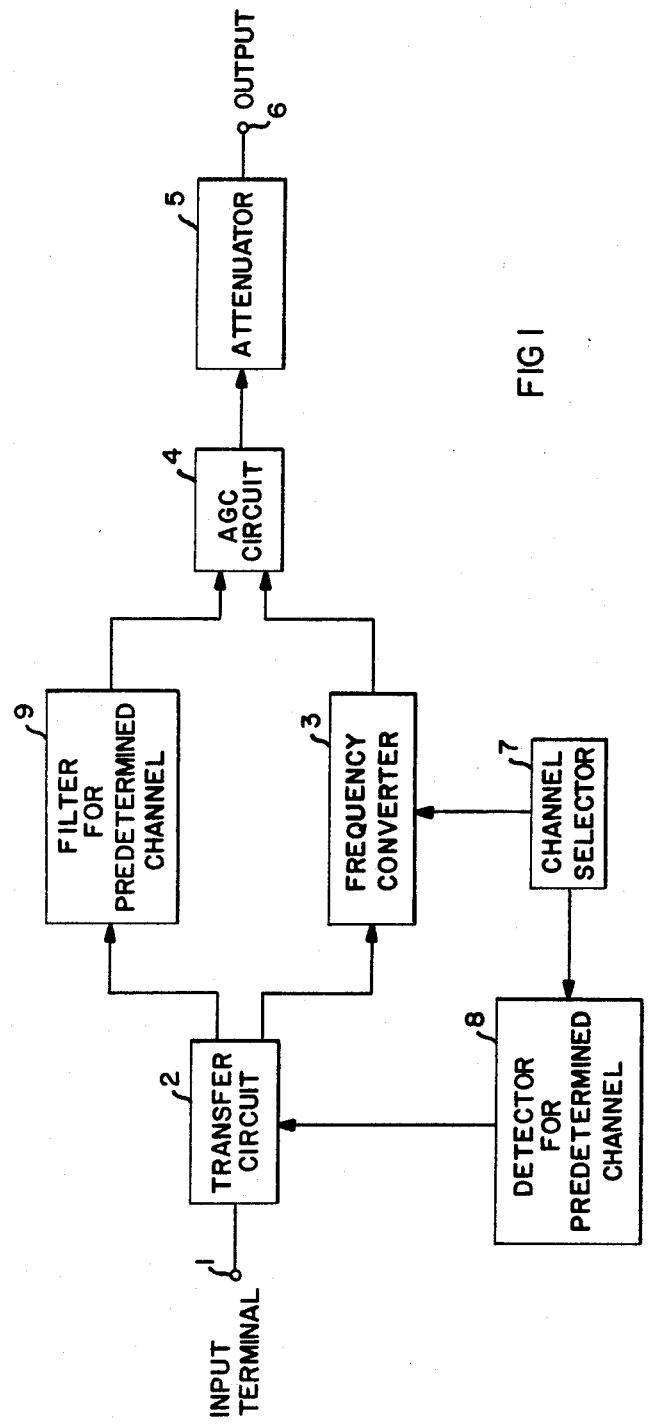

CATV CONVERTER

BACKGROUND OF THE INVENTION

This invention relates to a CATV converter, and more particularly to a converter wherein an input TV signal is converted into a frequency of a specific channel.

Ordinarily, in a CATV converter of conventional construction, a number of TV signals divided into, for instance, 30 channels are converted by a frequency converting circuit into a frequency of a specific channel (of for instance, Channel 2). Accordingly, by connecting an ordinary TV receiver set for Channel 2 with the converter, any one channel can be selected from the number of channels by manipulating the channel selecting buttons on the converter.

However, in the case in which channel selection by the button on the converter is for the same channel (e.g. 2) as the TV receiver setting, the input and output frequencies of the converter are made substantially equal (to the frequency of Channel 2), thus creating a beat frequency (a so-called channel beat) and deteriorating the image quality. Although no beat will be created when the frequencies of the input and output are absolutely equal, a slight difference always exists therebetween particularly when one part of the input signal leaks to the output side or one part of the output signal leaks to the input side through peripheral circuits, and the beat creates a stripe-shaped irregularity on the picture tube.

An object of the present invention is to provide a CATV converter wherein no beat is caused, even when the selected channel coincides with the specific channel.

BRIEF DESCRIPTION OF THE DRAWING

The accompanying single drawing indicates a block diagram of an embodiment of the present invention.

DETAILED DESCRIPTION OF THE INVENTION

The invention will now be described in detail with reference to the accompanying drawing, wherein numeral 1 designates an input terminal receiving TV signals in a number of channels. Numeral 2 designates a transfer or switching circuit which ordinarily sends a signal from the input terminal 1 to a frequency converting circuit 3. Numeral 4 designates an AGC (automatic gain control) circuit, numeral 5 an attenuator, and numeral 6 designates an output terminal which is connected to the input terminal (not shown) of an ordinary TV receiver. Numeral 7 designates a channel selecting device wherein a desired channel is selected by manipulating selecting buttons. The selected result is surveyed by a device 8 for detecting the selection of a specific channel. When the device 8 detects the selection of the specific channel, for instance, Channel 2, it sends a signal to the transfer circuit 2 to operate the same so that the TV signal introduced from the input terminal 1 is transferred to a filter 9 to be used for the specific channel.

The constructions of the channel selector 7 and the frequency converting circuit 3 may be substantially the same as those of the conventional CATV converter. The channel selector 7 may be provided with, for instance, thirty channel selecting buttons, each button corresponding to one of the DC voltages generated therein. By pushing a button, a DC voltage (channel selecting voltage) is applied to a varactor diode in the frequency converting circuit 3 thereby changing the oscillation frequency of a local oscillator to a selected frequency, and a frequency corresponding to the channel selected by the channel selecting button can be obtained.

The CATV converter according to this invention operates as follows.

TV signals in a number of channels transmitted from a CATV center through a cable are introduced through the input terminal 1 and the transfer circuit 2 to the frequency converting circuit 3. After the channel selector 7 selects a desired channel, the desired channel frequency is converted by the frequency converting circuit 3 to the frequency of the specific channel (in this example, Channel 2). The output of the circuit 3 is sent through the AGC circuit 4, the attenuator 5, and the output terminal 6 to the TV receiver. A TV receiver set for the predetermined channel thus can receive any one of a number of channels ranging from 20 to 30 by manipulating the selecting push buttons in the channel selector 7.

However, if the channel selector 7 selects the predetermined individual channel (here Channel 2), the device 8 for detecting the selection of the predetermined channel responds to the channel selecting voltage corresponding to the predetermined channel, and operates the transfer circuit 2 so as to transfer the TV signals to the filter 9. The filter 9 passes only the frequency of the predetermined channel to the AGC circuit 4, attenuator 5, and the output terminal 6 to the TV receiver.

As described hereinabove, according to the present invention, the difficulty of producing a beat frequency in the received signal can be eliminated by this inexpensive expedient. In the above described arrangement, the device 8 for detecting the selection of a predetermined channel may otherwise be eliminated, and a simple mechanical switch may be interconnected with the channel selector 7.

Since the creation of a beat frequency at the time where the input and output frequencies are substantially equal can be eliminated by simply attaching a circuit to the conventional converter, the production cost of a CATV system can be substantially reduced, and the image quality thus obtainable can be substantially improved.

What is claimed is:

1. A CATV converter comprising a frequency converting circuit for converting the frequency of an input TV signal into a frequency of a predetermined channel, a filter provided in parallel with said frequency converting circuit to pass only signals of the same frequency as the frequency of said predetermined channel included in said input TV signal, a transfer circuit for transferring said input TV signal to either one of said frequency converting circuit or said filter to extract said predetermined channel, a channel selector, and means for detecting selection of said predetermined channel coupled to control said transfer circuit, whereby when said detecting means detects said selection of said predetermined channel, said transfer circuit transfers said input TV signal to said filter passing said predetermined channel, and when any other channel than said predetermined channel is selected, said transfer circuit transfers said input TV signal into said frequency converting circuit.

2. A selected channel circuit for connection to a converter circuit receiving as an input a CATV signal having a plurality of channels and providing at an output an output signal having a selected channel carrying one of the input signal channels determined by a channel selector, the selected channel circuit comprising a filter coupled to receive the CATV signal as an input and pass only the selected channel to the converter output and a transfer circuit responsive to the channel selector, the transfer circuit being coupled to receive the CATV signal and connect the CATV signal to the filter input when the selected channel is selected by the channel selector and to connect the CATV signal to the converter input when a channel other than the selected channel is selected by the channel selector.

* * * * *